(12) United States Patent
Ballagh et al.

(10) Patent No.: US 7,363,600 B1
(45) Date of Patent: Apr. 22, 2008

(54) METHOD OF SIMULATING BIDIRECTIONAL SIGNALS IN A MODELING SYSTEM

(75) Inventors: Jonathan B. Ballagh, Longmont, CO (US); Roger B. Milne, Boulder, CO (US); Jeffrey D. Stroomer, Lafayette, CO (US); L. James Hwang, Menlo Park, CA (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 740 days.

(21) Appl. No.: 10/691,343

(22) Filed: Oct. 21, 2003

(51) Int. Cl.
*G06F 17/50* (2006.01)
*G06F 9/455* (2006.01)

(52) U.S. Cl. .................. 716/3; 716/4; 716/5; 703/13; 703/14; 703/23; 703/27

(58) Field of Classification Search .............. 716/4–5, 716/16–18; 709/227, 250; 370/390, 431–432; 703/23–28, 13–14
See application file for complete search history.

(56) References Cited

U.S. PATENT DOCUMENTS

| | | | |
|---|---|---|---|
| 6,377,992 B1* | 4/2002 | Plaza Fernandez et al. | 709/227 |
| 6,961,691 B1* | 11/2005 | Selvidge et al. | 703/28 |
| 2001/0034598 A1* | 10/2001 | Swoboda | 703/26 |
| 2002/0107682 A1* | 8/2002 | Sample et al. | 703/23 |
| 2003/0214965 A1* | 11/2003 | Chen et al. | 370/431 |
| 2004/0250244 A1* | 12/2004 | Albrecht | 717/135 |
| 2005/0022143 A1* | 1/2005 | Butts et al. | 716/5 |
| 2006/0221962 A1* | 10/2006 | Previdi et al. | 370/390 |

* cited by examiner

*Primary Examiner*—Paul Dinh
(74) *Attorney, Agent, or Firm*—Walter D. Fields; Kevin T. Cuenot

(57) ABSTRACT

A method of modeling a design in a high level modeling system that supports unidirectional data flow, may comprise identifying a bus-block to represent a connectivity of a bi-directional bus in an system. The bus-block may be represented in serial relationship with the bus. Taps may interface the bus via the bus-block. During simulation, the bus-block emulates behavior of a tri-state buffer in series with an input line for the tap interface. During synthesis, pairs of unidirectional input and output lines of opposite data-routing orientation, which may emulate bus ports to the bus-block, may be collapsed to a single bus port. The synthesis may further generate a netlist that may dispose a tri-state buffer between a tap input and the bus. The netlist may also represent layout of the tri-state buffer for driving an output of the tap.

18 Claims, 6 Drawing Sheets

METHOD OF SIMULATING BIDIRECTIONAL SIGNALS IN A MODELING SYSTEM

FIELD OF THE INVENTION

The present disclosure relates to system modeling and simulation, and more particularly to methods of modeling bidirectional signals in a high level modeling environment of single direction data flow functionality.

BACKGROUND

As electrical system designs advance and become more complex, it can become more difficult to obtain electrical system analysis tools having an ability to handle all types of modules. Typical computer aided analysis tools at the system/logic analysis level may not have all of the semiconductor or system intellectual property cores and/or library macros to address each aspect within the realm of circuit and/or system level configurations.

To meet the needs for expanding system complexity and enhanced system analysis, tool designers may seek to improve intellectual property core sets and library macrocells. They may seek to improve their analysis capabilities in order to service the more sophisticated demands of potential customers. Sometimes, they may prefer to enhance their analysis capabilities to facilitate hardware design and verification by evolving alternative uses from their existing structures and macros.

The increased levels of integration have enabled greater complexities for systems, such as System-On-Chips (SoC), Digital Signal Processors (DSP), embedded systems, and field-programmable-gate-array (FPGA) based solutions at a board level. Most of these systems may incorporate bi-directional busses and data-routing links. Additionally, they may employ tri-state buffer devices. For example, a typical microprocessor system may use a PCI, ISA, or VME bus, or another bus architecture at the system level for connecting to a number of different elements. Typically, such busses are bi-directional to enable data-routing in either forward or reverse directions.

Some system-level analysis tools, however, may have difficulty handling propagation of signals in both directions as may be required for simulating operation of bi-directional busses. These tools may also have difficulty simulating bi-directional operation between busses and tap interconnects, which may be associated with peripheral components along the bus. In some instances, e.g., where a receiver may also be defined to allow for transmission as well, asynchronous loop hazards may be present within the system level analysis tool.

SUMMARY

In one embodiment of the present invention, a method of analyzing a model of a system in a high level modeling system of unidirectional functionality, may comprise determining if a link in the system model is bi-directional. Based on the determination, first and second unidirectional links of opposite data-routing orientation may be used as simulation constructs to emulate the bi-directional link.

In a further embodiment, the first and second unidirectional links may be substituted for the bi-directional link and disposed at a location associated with a tap interconnect. Unidirectional input and output tap lines may be used to represent the tap. At least one of the input and output tap lines may further be emulated in series with a tri-state buffer.

In another embodiment, a method of simulating a system model in a high level modeling system that supports unidirectional data flow, may comprise identifying a bus-block and representing the identified bus-block incorporated with the system model and associated serially with a bus. A tap may be represented to interface the bus via a port to the identified bus-block.

In a further embodiment, the method of simulating may further comprise emulating a tri-state buffer in series with an input line of the tap. The tri-state buffer may be emulated to drive outputs of the identified bus-block associated with bus ports and also an output tap line, which may further be enabled based on a write-enable signal.

In yet a further embodiment, the method of simulating may determine the presence of signals at inputs for the bus ports. If a signal may be determined present at an input to a port when receiving at the tap input line and/or a write enable signal, then a collision event may be identified.

In a method of synthesis for another embodiment of the present invention, a system model may be examined to determine a bus-block. If a bus-block is determined, translation of the system model for realization may collapse first and second bus ports to the bus-block into a single bus terminal.

In a further embodiment, the model of the bus-block may comprise pairs of unidirectional data lines of opposite data-routing orientation for emulating the bus of bi-directional signal flow capability. During translation of the bus-block for the synthesis, each pair of unidirectional data lines for the bus-block may be collapsed to a bi-directional bus port for respective one of the first and second bus ports interfacing the bus-block.

In yet a further embodiment, the synthesis may generate a netlist, which may specify placement of a tri-state buffer in series with a tap input to the bus terminal. In a further embodiment, the synthesis may yield the netlist to specify a layout for the tri-state buffer with an enable input and an output coupling of the tri-state buffer to also drive an output line of the tap interconnect.

BRIEF DESCRIPTION OF THE DRAWINGS

Embodiments and features of the invention will become more apparent from the detailed description and the appended claims, with reference to the accompanying drawings, in which:

DETAILED DESCRIPTION

Figure 1:
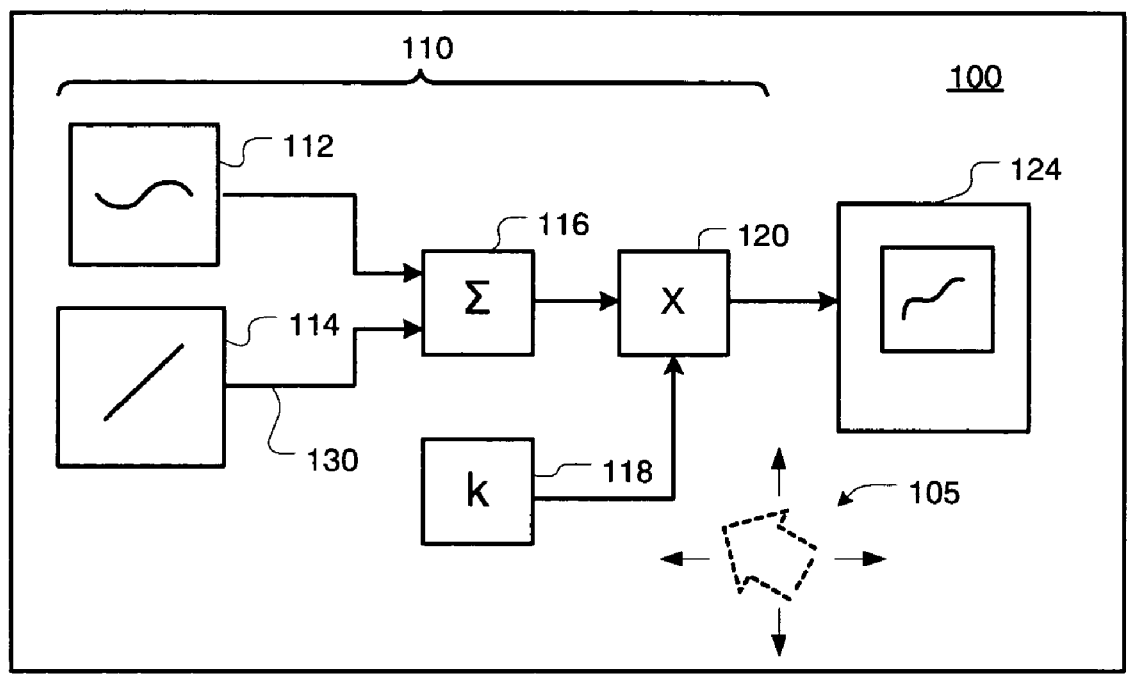
FIG. 1 shows a schematic representation of an electrical system in a design window useful for illustrating an aspect for an embodiment of the present invention.

In the following description, numerous specific details may be set forth to provide an understanding of exemplary embodiments of the present invention. It will be understood, however, that alternative embodiments may comprise sub-combinations of the disclosed examples.

Additionally, readily established circuits and procedures of the exemplary embodiments may be disclosed in simplified form (e.g., simplified block diagrams and/or simplified description) to avoid obscuring an understanding of the embodiments with excess detail. Likewise, to aid a clear and precise disclosure, description of known processes—e.g., clocking, state-machines, programming procedures, descriptor language translations, IP library macro-cell routine calls, rule definitions, etc.—may similarly be simplified where persons of ordinary skill in this art can readily understand their structure, interrelations, procedures and operation by way of the drawings and disclosure.

As used herein, "processor" and/or "control circuitry" may be meant to describe, e.g., electronic circuits comprising logic gates, flip-flops, etc. that may be integrated together. For example, state-machines or programmable FPGA arrangements or programmed processors may be operable to perform similar procedures, data manipulations and/or controls as may be disclosed herein.

Referencing FIGS. 1-2, a system-level, computer aided design, analysis and/or synthesis tool 200 (hereinafter, "CAD system") may serve as a high level modeling system and may comprise memory 240 in communication with processor 210. In FIG. 2, the memory is illustrated with separate portions, such as respective mapped portions for a design or system model 242, simulation results, hardware description language (HDL) netlist(s) 244, hardware (HW) layout 246, analysis software 260, etc. The analysis-translation-synthesis software may also comprise portions for their library (libraries) 250, which may include definitions and procedures for the various macrocells and associated core devices. Although each of the mapped portions of the memory may be mapped together contiguously, generally, these portions map across non-contiguous regions of memory 240.

Further referencing FIG. 2, processor 210 of CAD system 200, as a high level modeling system, may execute computer aided design software code, which may be obtained from a mapped portion 260 of the memory 240 associated with a SW analysis tool. The analysis module may process at least a portion of the system model or design as may be retained in mapped portion 242 of memory 240 associated with the design.

A display of CAD system 200 may present windows 100A, 100B, . . . to offer graphical representations of, e.g., a model of an electrical system design, results from analysis of the design, a library with icons of components available for incorporation into a system model, netlist translation and/or layout, etc.

For example, during creation of a design, a user may select a plurality of blocks from a library and may place them at various locations in a design window, such as a system design window (e.g., 100 of FIG. 1) of the high level modeling system. In an exemplary electrical design, referencing FIG. 1, blocks 112, 114, 116, 118, 120 may be representative of, e.g., a sinusoidal source, a ramp source, a summer, a constant source and a multiplier, respectively. The graphical icons would be associated with pre-defined device models per respective IP cores and/or macrocells within library 250 of the high level modeling system. The cores and macrocells associated with the functional system blocks may establish the rules by which to enable presentation, simulation, translation and/or synthesis for realization. Thus, they may include any translation needs to be employed during analysis and/or realization procedures to be performed on an electrical system model or design.

In particular embodiments, the blocks to a design may each be associated with different modeling provisions, such as presentation, simulation and synthesis. A first provision may establish how to illustrate a particular block in a design window for view. A second provision may associate the block to a SW (software) module capable of simulating its operation responsive to different input values. Such a SW module may establish the rules by which to emulate the propagation of signals and responsiveness of the block to different input values when presented thereto. A third provision may establish rules by which to synthesize the hardware, which may include translation needs for generating a netlist and/or layout for realization of the block within an actual physical implementation for the system.

In a particular embodiment, the SW module for simulation may be integrated with a presentation and analysis tool(s) such as, e.g., MATLAB and/or Simulink. MATLAB and Simulink may be available from The Mathworks, Inc. Additionally, the modules for synthesis or HW realization—e.g., System Generator, available from Xilinx, for initial translation into HDL—may be integrated with a layout tool.

Modeling tools (e.g., System Generator) may be operable in combination, as an add-on, with the simulation tool (e.g., Simulink) of a CAD system platform. Operating these tools at the system level, a user may be able to develop high-performance designs such as a digital signal processing (DSP) system while working almost entirely at a high-level modeling perspective.

In a particular embodiment, a computer aided design (CAD) system for a high level modeling environment may comprise synthesis tools with a library of elements tailored to gates and logic element realizations of, e.g., field programmable gate array, specific technology platform. System modeling and simulation tools such as, e.g., MATLAB and Simulink with System Generator, may comprise cores and macrocells within their library links capable of implementing bit/cycle-true representations of the elements of the model. These tools may further enable automatic netlist translation capability, e.g., for generation of synthesizable Hardware Description Language (HDL) code. The HDL code, in turn, might then be directed to pre-defined hardware emulation and hardware realization algorithms.

Technology platforms may be available to indicate how the elements of the system are to be implemented or realized. For example, a technology platform such as Virtex-II Pro Platform FPGAs and Spartan-IIE FPGAs (of Xilinx, Inc.) may specify into which technology a design is to be translated for synthesis realization and/or emulation. Accordingly, by use of these high-level computer aided design-modeling-analysis-translation-synthesis tools, a user may be able to create, e.g., an electrical system design for realization in a particular platform while maintaining a relatively high-level, system design perspective. Furthermore, source code representations of the system design may be readily transformed into the particular gate-level, HDL netlist representations for realization, emulation and design verification.

In a particular example, a user may operate I/O 220 to interact with a high level modeling system (or CAD tool). While viewing a window of graphical user interface, e.g., system design window 100 of FIG. 1, the user may create and define a system model 110. Data representative of the system model may be retained in mapped portion 242 of memory 240, which may be set aside for the system model.

In another embodiment, data representative of a design of an electrical system may be obtained from a previously defined SW model that may be imported into CAD system 200.

Figure 2:
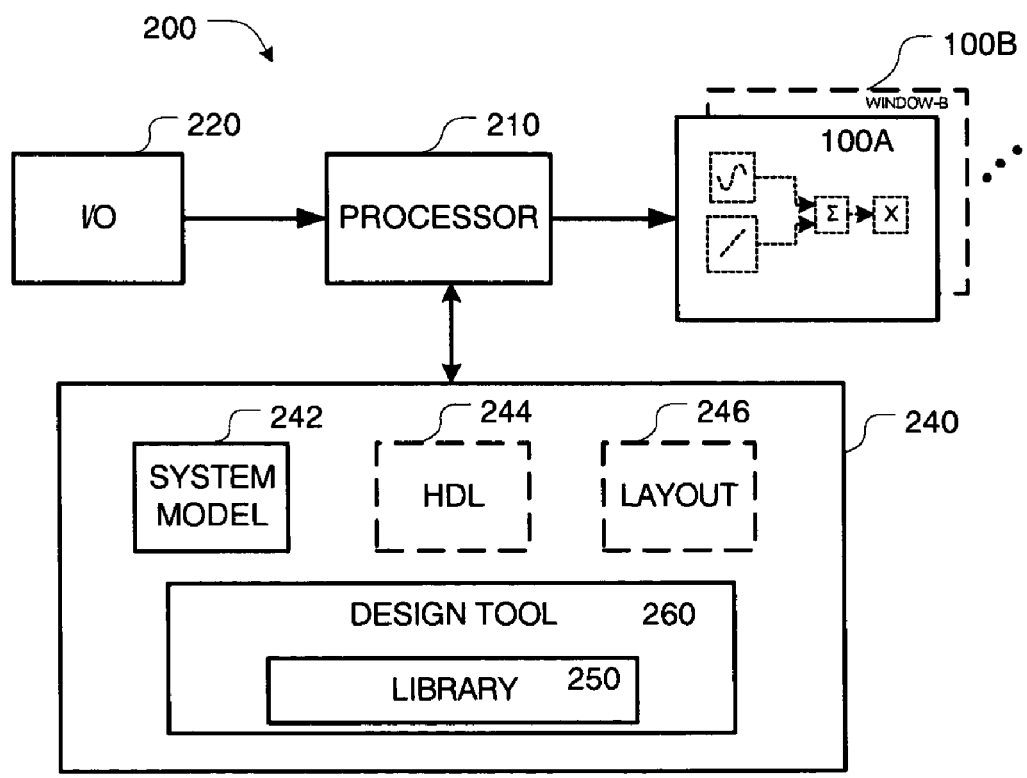
FIG. 2 shows a block diagram of a high-level modeling system to assist design, simulation, synthesis or emulation of design for exemplary embodiments of the present invention.

While working with various windows, e.g., 100, 100A, 100B . . . , further referencing FIGS. 1-2, the user may operate various I/O (e.g., mouse, CAD pen, keyboard, etc.) to navigate selection/pointer icon 105 across visual representations and/or windows and may select blocks by which to create a system model or design. In a particular application, the user may select from predefined blocks in a library presented in, e.g., library window 100B. The user may operate the I/O device(s) to place, define an operation of, designate a technology platform for, and/or label the blocks that have been selected for the system model. In some cases, while creating the system design, the user may traverse a plurality of windows—e.g., platform window, library window 100B, design window 100A, netlist window and/or an analysis window.

Further referencing FIGS. 1-2, processor 210 may execute design SW of memory map region 260 to process a designated model of an electrical system (as may be obtained from data in mapped region 242 of memory 240). The execution of the design SW module may provide a graphical representation of the electrical system model in design window 100. Further, the design software may produce an executable specification of the system model. For example, the design module within the CAD system may translate a model for an electrical system into an HDL netlist for enabling bit/cycle accurate representations of the modeled system design for realization and emulation. Again, in certain embodiments, a technology platform may be specified for physical realization of the electrical system. The selected technology may designate, e.g., a given field programmable array (FPGA) device, chip-set, semiconductor design rule, device speed, operational voltage, photolithography, etc., by which to realize the physical electrical system.

With appropriate models and core macros for the library components, a hardware realization of the modeled system design will operate substantially the same as its emulation and as may have been previously represented during its simulation and creation. In other words, the computer aided design-modeling-analysis-translation-synthesis tool(s) of the high level modeling system may be used to design and analyze, e.g., an electrical system model per a system-level perspective. A designer, perhaps using an iterative design and analysis process, may be able to refine a system model based on results obtained from various simulation(s). A generator tool (e.g., such as System Generator) may then be initiated to process the design and provide a netlist by which to define devices (e.g., per the HDL language) and a layout for implementing the physical system.

In a design window (e.g., 100 of FIG. 1), interconnects may be illustrated between the blocks of a system model for representing signal paths. For example, interconnect 130 may represent a signal path from ramp source 114 to summer 116. Some high level modeling systems may comprise analysis tools or library components (which may be referenced alternatively by "tool-set") that only support signal paths of a single direction of data flow—i.e., unidirectional. With such analysis tools, therefore, a bi-directional line, such as a bus, for the design may pose a problem for high-level system analysis and emulation thereof.

In accordance with an embodiment of the present invention, a bus-block model or macro therefor may be represented as comprising two unidirectional signal paths for enabling emulation of a bi-directional line. A first signal path of the bus-block may allow flow of data in one direction; while a second signal path may allow for the flow of data in another direction opposite the first. Such a bus-block for a high level modeling environment may, therefore, be structured with a combination of sub-elements to call existing macros and/or core provisions for enabling simulation, translation, synthesis realization and/or emulation with the pre-defined macros.

Figure 7:
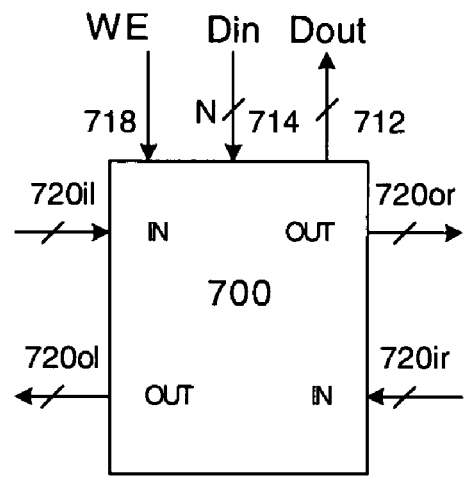
FIG. 7 shows a representation of a bus-block for an embodiment of the present invention.

Referencing FIG. 7, a bus-block 700 may be represented with left and right pairs of input/output lines 720*il*/720*ol*, 720*ir*/720*or*. The unidirectional, oppositely directed lines of each pair may effectively model, at least in part, a bi-directional link. A first signal path through bus-block 700 may be emulated between left input 720*il* and right output 720*or* and may simulate data flow in a first direction. A second signal path may be emulated between right input 720*ir* and left output 720*ol* and may simulate data flow in a second direction opposite to the first direction. In this example, it is understood that the nomenclatures "right" and "left", associated with the respective inputs and outputs are used merely for purposes of convenience to assist distinction of the signal paths of the oppositely directed, data-flow interrelationship.

Further referencing FIG. 7, output and input tap lines 712, 714 may be represented as coupled to bus-block 700 for assisting simulation of a tap interconnect to the bi-directional bus. In other words, bus-block 700 may be used to provide for a tap interconnect in a system model, and may be used to simulate bi-directional signal flow of the bus and to simulate signal flows between the bus and respective input and output tap lines. Tap input line(s) 714 may propagate data to the bus-block, while tap output line(s) 712 may propagate data from the bus-block.

It will be understood that signal paths 720 may comprise a bit width equal to that of the tap input and output interconnects. In other words, if the input and output interconnects of the tap may comprise a bit-width of 32 bits, then the signal paths 720*il*, 720*or*, 720*ir*, 720*ol* may similarly comprise bit-widths of 32 bits.

In one embodiment, the illustrated icon for bus-block 700, as presented in FIG. 7, may be included in library 250 of a design module 260 of CAD System 200 (FIG. 2), which CAD tool of a high level modeling system may be operable for aiding design, simulation, translation and/or synthesis). When the processor of CAD system 200 executes the software of design module 260, a representation of the bus-block, e.g. a visual code based element, may be presented to a designer for selection within at least part of a library window 100B. The execution of the design SW 260 may further enable the designer to work with (e.g., select, incorporate, identify, position, define a technology platform, etc.) the bus-block during design, analysis, translation, synthesis or emulation for a system such as an electrical circuit system.

Figure 8:
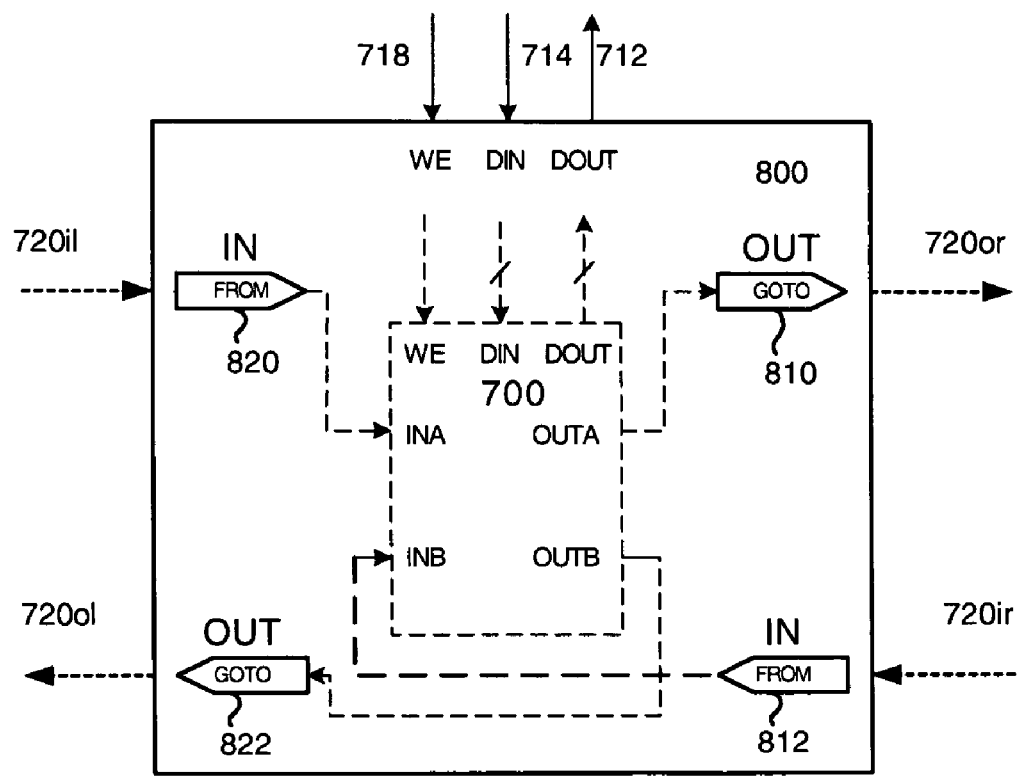
FIG. 8 is a schematic diagram illustrating macro associations which may be used to assist interconnect modeling of a block-bus in accordance with an embodiment of the present invention.

In one embodiment, referencing FIGS. 7-8, the visual based element 700 for the bus-block may be associated with bus-block simulation routine(s) for defining its signal responsiveness. For example, in Simulink/System Generator, FROM and GOTO blocks may be used to implicitly define connections for routing of signals between ports of the bus-block's simulation module 800 for enabling the implicit handling of signals within a simulation routine during simulation of a system model. Rules may be established in the simulation routine to define relationships between the various ports by which to simulate signal propagation or responsiveness for the bus-block in response to different input levels. Names may also be defined for the FROM and GOTO blocks to associate the various signal interconnections within a given system model.

In a further embodiment, a label may be assigned with a bus-block. The label assigned to the bus-block may identify the bus-block with a particular bus. Tap interconnections to a given bus may thus be represented by tap lines (e.g., Din and Dout 714, 712) coupled to a bus-block that has been labeled for identification with the bus.

In another embodiment, realization for a model of a tap interconnect to a bi-directional bus may include implementing a tri-state buffer disposed in series with a tap line. To represent the interconnect in a system model, a visual, code-based module for bus-block 700 substituted for the tap interconnect may further comprise enable input 718. The enable input 718 may be driven as defined by the user to enable the tri-state buffer for propagating a signal therethrough. In some embodiments, logic (not shown) may enable the tri-state based on the presence of signals on at least one of the input lines.

In a particular example associated with synthesis and/or hardware layout, the bus-block may be referenced as "BUS INTERFACE SUBSYSTEM." When a CAD system translates the model during hardware realization, a translation module may collapse each pair of input and output ports (720*ir*-720*or* and 720*il*-720*ol*) down to single bi-directional ports. These ports, in turn, may then be further collapsed to the nets of which the ports are attached. For example, the translation tool may produce a netlist (e.g., a hardware description language (HDL) netlist) for a bi-directional bus. It may further specify widths for the parameters of the respective ports using generics as follows:

entity bus_interface is
    generic (din_width : integer := 8;
      dout_width : integer := 8;
      bus_width integer := 8);
    port (we : in std_logic;
      din : in std_logic_vector (din_width-1 downto 0);
      dout : out std_logic_vector (dout_width-1 downto 0);
      bus : inout std_logic vector (bus_width-1 downto 0);
    end bus_interface;

When processed by a translation application, the modeled bus-block may be interfaced via the interconnects defined by the HDL netlist. Further, the translation module may realize a tri-state buffer, per the bus_interface routine. In one embodiment, the bus_interface entity routine may instruct a realization to dispose the tri-state buffer in series with the data input lines (e.g., din). In an example as shown below, a netlist to this embodiment may again use an "entity" definition. Widths for the data in and data out ports may be defined similarly to the bus width. Further, the device may be characterized to implement operation of a tri-state buffer.

Another netlist for a Bus Interface:
    library IEEE;
    use IEEE.std_logic_1164.all;
    entity bus_interface is
    generic (bus_width : integer := 8);
    port (we : in std_logic;
      din : in std_logic_vector(bus_width-1 downto 0);
      dout : out std_logic_vector(bus_width -1 downto 0);
      dbus : inout std_logic_vector(bus_width-1 downto 0));
      end bus_interface;
    architecture behavioral of bus_interface is
    begin
    dbus <= din when we = '1'
    else (others => 'Z');
    dout <= dbus;
    end architecture behavioral;

In this example, each of the data input (din), data output (dout) and data bus (dbus) ports have been defined using the standard logic vectors and with bit indexes tied to the previously defined bus width. The write enable port (we) may be defined as a single standard logic input. In an architecture behavior portion of the netlist, the data bus (dbus) may be characterized to assume values of the data input (din) port when the write enable (we) is activated. Otherwise, it may assume a high impedance condition (tristate) when the write enable has not been activated. Further, the data output (dout) may assume values of the data bus (dbus).

Figure 5:
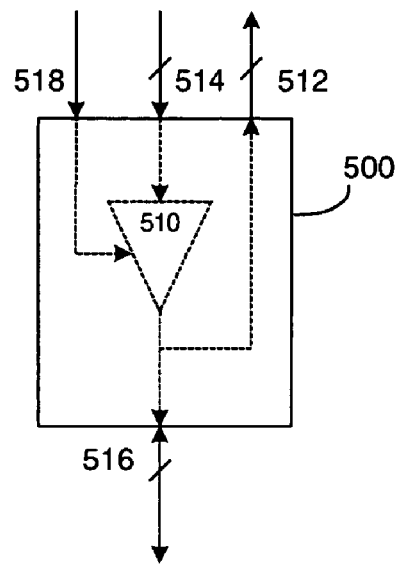
FIG. 5 shows a representation for an actual physical tap interconnect to a bi-directional bus for an embodiment of the present invention associated with realization.

Referencing FIGS. 7 and 5, tri-state buffer 510 may be disposed in series with the tap's data input (Din) port 514. Write-enable (WE) port 518 may drive the control terminal (s) of tri-state buffer(s) 510. The output of the tri-state buffer(s) may drive respective lines of bi-directional bus 516. Additionally, the output(s) of the tri-state buffer(s) 510 may also drive the tap output lines 512.

Figure 6:
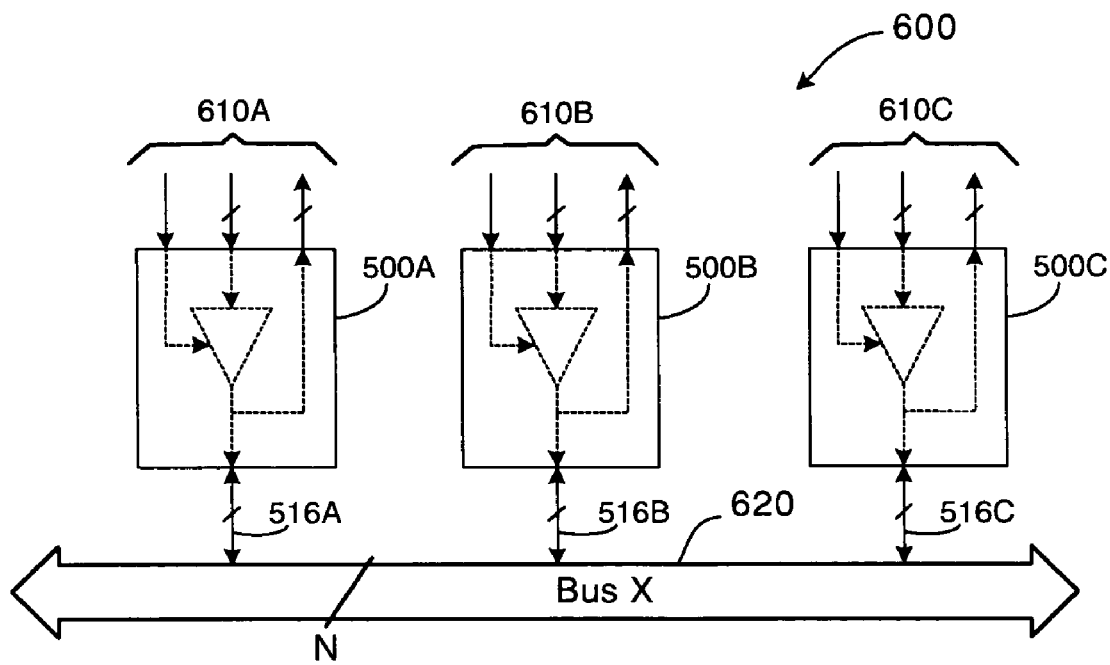
FIG. 6 shows a representation for a physical circuit for a portion of an electrical system comprising a plurality of tap interconnects coupled to a bi-directional bus, which may be synthesized in accordance with exemplary embodiments of the present invention associated with realization.

In a particular application, referencing FIG. 6, synthesis of a portion of a system model or design may realize three bus interconnect circuits 500A, 500B, 500C for interconnection of three different taps 610A, 610B, 610C to bus 620. The realization may also provide for tri-state buffers in series with the respective tap input ports. In a system application, the taps 610 could be used to interface various peripheral circuits (not shown).

Figure 9:
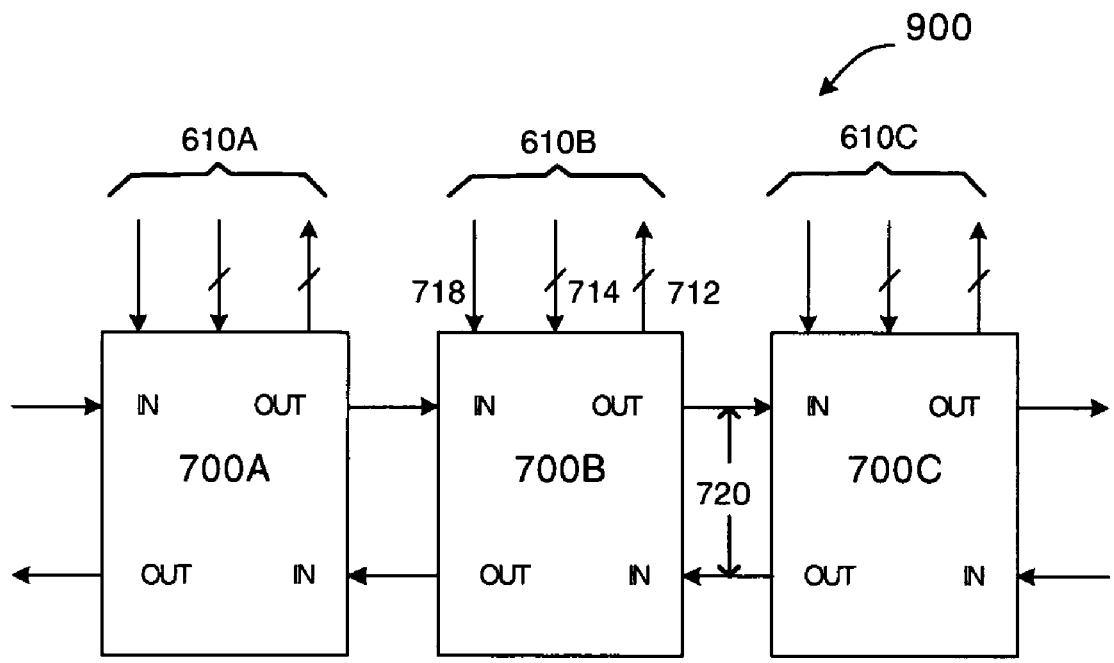
FIG. 9 shows a plurality of bus-blocks for representing a plurality of tap interconnects to a bi-directional bus for an electrical system as they may be represented in a high level modeling system that supports unidirectional data flow, in accordance with an embodiment of the present invention.

Referencing FIG. 9, at least a portion of a system model 900 may be represented by bus-blocks 700A, 700B, 700C for coupling respective tap circuit interconnects 500, 516 (A-to-C per FIG. 6) to a bus. In this representation of system model 900, bus-blocks 700A, 700B, 700C and respective unidirectional line pairs 720 to/from and between the blocks, may be representative of unidirectional, oppositely directed links—i.e., to emulate the bi-directional bus. Each of taps 610A, 610B, 610C to respective bus-blocks 700A, 700B, 700C may be represented with data in, data out and write enable ports 714, 712, 718 for interfacing to the bus.

In one embodiment, these bus-blocks 700, e.g., as used in the system model or design 900 of FIG. 9, may each be associated with high level modeling of a given bus, bus interconnect and/or tri-state interfacing portions of an electrical system. During design, analysis, translation and/or synthesis of a system, a designer may use the bus-block representations for modeling the various elements for the electrical system. These system elements may then be presented, as selected by the designer, in a design window of a CAD system, such as CAD system 200 of FIG. 2. When processed to generate a netlist in accordance with a particular embodiment, the three bus blocks could be presented via a netlist (e.g., VHDL) as follows:

```
A netlist for a Bus Interface:
library IEEE;
use IEEE.std_logic_1164.all;
entity fig9_ex is
generic (bus_width : integer := 8);
port (dbus : inout std_logic_vector(bus_width-1 downto 0));
end fig9_ex;
architecture struct of fig9_ex is
component bus_interface
generic (bus_width : integer := 8);
port (we : in std_logic;
din : in std_logic_vector(bus_width-1 downto 0);
dout : out std_logic_vector(bus_width -1 downto 0);
dbus : inout std_logic_vector(bus_width-1 downto 0));
end component; -- end bus_interface
component comp_700a
generic (dout_width : integer := 8;
din_width : integer := 8);
port (we : out std_logic;
din : out std_logic_vector(din_width-1 downto 0);
dout : in std_logic_vector(dout_width-1 downto 0));
end component; -- end comp_700a
component comp_700b
generic (dout_width : integer := 8;
din_width integer := 8);
port (we : out std_logic;
din : out std_logic_vector(din_width-1 downto 0);
dout : in std_logic_vector(dout_width-1 downto 0));
end component; -- end comp_700b
component comp_700c
generic (dout_width : integer := 8;
din_width : integer := 8);
port (we : out std_logic;
din : out std_logic_vector(din_width-1 downto 0);
dout : in std_logic_vector(dout_width-1 downto 0));
end component; -- end comp_700c
signal data_bus : std_logic_vector(bus_width-1 downto 0);
signal comp_700a_we : std_logic;
signal comp_700a_din : std_logic_vector(bus_width-1 downto 0);
signal comp_700a_dout : std_logic_vector(bus_width-1 downto 0);
signal comp_700b_we : std_logic;
signal comp_700b_din : std_logic_vector(bus_width-1 downto 0);
signal comp_700b_dout : std_logic_vector(bus_width-1 downto 0);
signal comp_700c_we : std_logic;
signal comp_700c_din : std_logic_vector(bus_width-1 downto 0);
signal comp_700c_dout : std_logic_vector(bus_width-1 downto 0);
begin
-- Drive the top-level dbus port with the data_bus signal.
dbus <= data_bus;
-- Instantiate components 700a, 700b, and 700c.
ex700a_inst : comp_700a
generic map (dout_width => bus_width,
din_width => bus_width)
port map ( we => comp_700a_we,
din => comp_700a_din,
dout => comp_700a_dout);
ex700b_inst : comp_700b
generic map (dout_width => bus_width,
din_width => bus_width)
port map ( we => comp_700b_we,
din => comp_700b_din,
dout => comp_700b_dout);
ex700c_inst : comp_700c
generic map (dout_width => bus_width,
din_width => bus_width)
port map ( we => comp_700c_we,
din => comp_700c_din,
dout => comp_700c_dout);
-- Connect components 700a, 700b, and 700c to three
-- bus interface components that share a common bus.
biface700a_inst : bus_interface
generic map (bus_width => bus_width)
port map( we => comp_700a_we,
din => comp_700a_din,
dout => comp_700a_dout,
dbus => data_bus);
biface700b_inst : bus_interface
generic map (bus_width => bus_width)
port map( we => comp_700b_we,
din => comp_700b_din,
dout => comp_700b_dout,
dbus => data_bus);
biface700c_inst : bus_interface
generic map (bus_width => bus_width)
port map( we => comp_700c_we,
din => comp_700c_din,
dout => comp_700c_dout,
dbus => data_bus);
end architecture struct;
```

The high-level definition of component fig9_ex may be established in an entity statement of the first few lines, and may be recited as comprising a port for a bus such as dbus. In an architecture structure portion of the code, also associated with the entity fig_9ex, a few lines of code in various groupings may provide different component declarations. Not only may a bus_interface component be declared, but also three other components such as comp_700a, comp_700b and comp_700c. The latter components may be understood in this example to correspond to blocks 700A, 700B and 700C of FIG. 9. Although the ports may be declared simplistically as they appear in FIG. 9 and merely to illustrate component attachments to the bus interface, it will be understood that other ports could also be declared within a more detailed system design and translation.

In addition to the component declarations of the netlist, signal declarations may recite internal labels by which to connect the various pieces. And after these declarations, a begin statement leads a first line to recite the data bus (dbus) port of an upper level be driven by signal data_bus. The next three code line groupings in this example may instantiate the three different components comp_700a, comp_700b and comp_700c. Essentially, the instantiations recite presence of the respective elements and may assign their generics and signals therefor. Additional instantiations of this example may set forth three separate bus interfaces that may tie respective components comp_700a, comp_700b and comp_700c to the bus. Accordingly, a signal data_bus of the data bus may be tied in common with each of the interfaces to the respective components. Again, although simple definitions, instantiations and interconnects have been presented in this example for a netlist generation, it may be understood that systems of greater complexity and/or port types could be similarly processed, and yet, be capable of addressing bidirectional emulation within a modeling environment of unidirectional means.

In another representation, tap interface circuits 500 may be realized to interface a bus with bi-directional interconnects 516 (FIG. 5). An example of this type of model translation is shown by comparing the interconnect 610 representations of the system model 900 of FIG. 9 with the various interface 610 realizations to bi-directional bus 620 in system 600 schematically illustrated in FIG. 6. When the translation tools are applied to the system model, e.g., the electrical system model 900 of FIG. 9, the realization of bi-directional interconnects 610A, 610B and 610C may result in the implementation of the electrical system.

In an embodiment of the present invention, a synthesis tool for at least a portion of the realization may comprise a module to translate the model to enable processing of the bi-directional bus or interconnect elements. This translation may also allow for the simulation, netlist generation and synthesis of tri-state buffers connected to the bi-directional elements.

Figure 3:
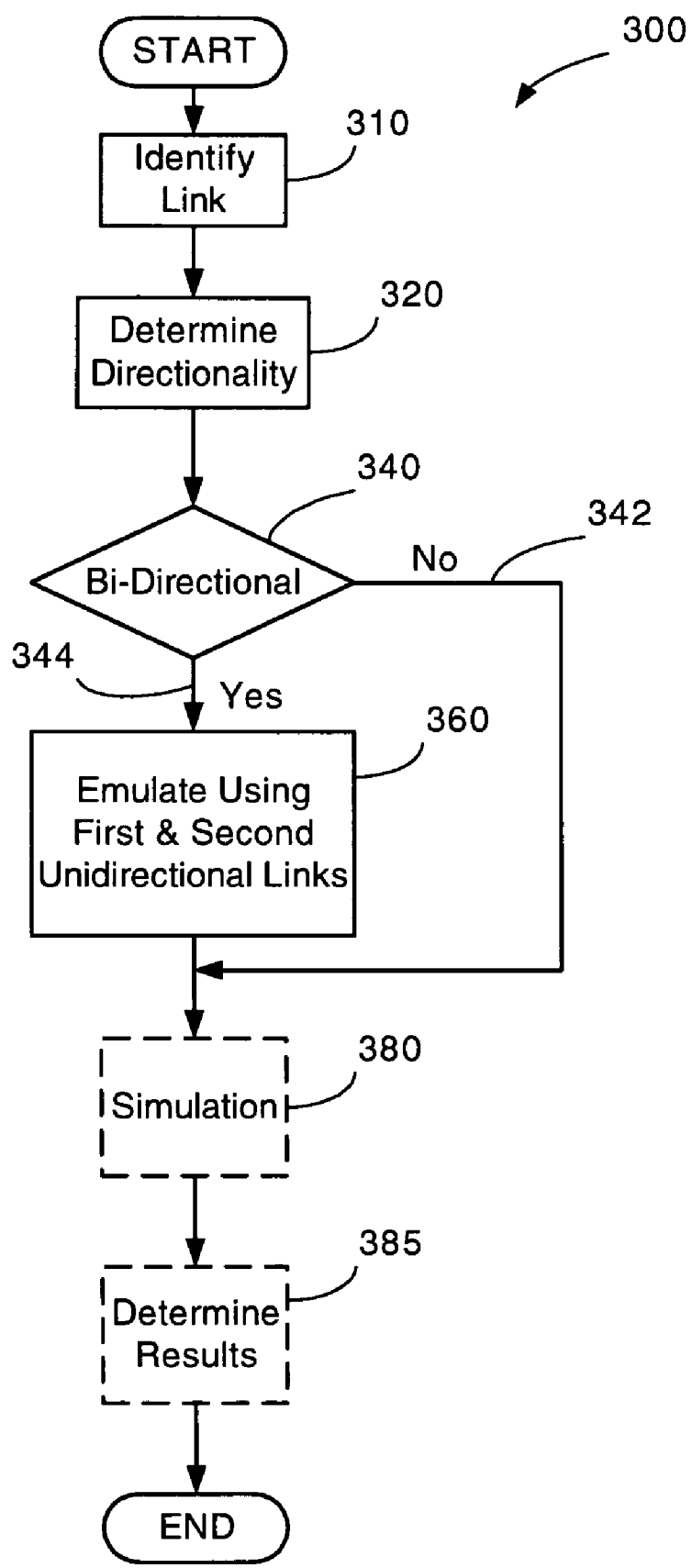
FIG. 3 is a simplified flow diagram for a method of analyzing a design in a high-level modeling system of unidirectional tool-sets in accordance with an embodiment of the present invention.

With reference to FIG. 3, an example of a method 300 of translation may comprise determining 320 a directionality of a link of a given system model or design previously selected 310 for import. If the link is determined to be bi-directional 340, 344, first and second unidirectional links of opposite data direction orientations may be substituted 360 for the bi-directional link.

Although, "link" has been used in this example to describe a signal channel, it may be understood that alternative terms could similarly be used—such as "line", "path", "interconnect", "connection", and "bus". For a "bus", it may comprise a multi-bit width having multiple channels or lines therefor.

In a particular embodiment, a pre-defined, bus-block modeling element (e.g. bus-block 700 as described earlier herein relative to FIGS. 7-9) may be used for emulating the bi-directional element. The bus-block may be associated with pre-defined macros for simulation, netlist generation, synthesis and/or emulation. These macros, in turn, may enable, e.g., high level modeling at the system level using a pair of unidirectional and oppositely directed data channels for emulating the bi-directional link, and for enabling translation or synthesis therefrom for realization of a bi-directional bus/line/link layout.

Further referencing FIG. 3, the system model or design resulting from the unidirectional data links or pre-defined bus-block provisions for the electrical system may then be simulated 380 and/or analyzed. Results from the simulation may be determined 385 and retained in a results portion of the analysis tools memory 240. The computer aided design, analysis, and/or layout system may further display the results from the analysis in a results window of a display.

Figure 4:
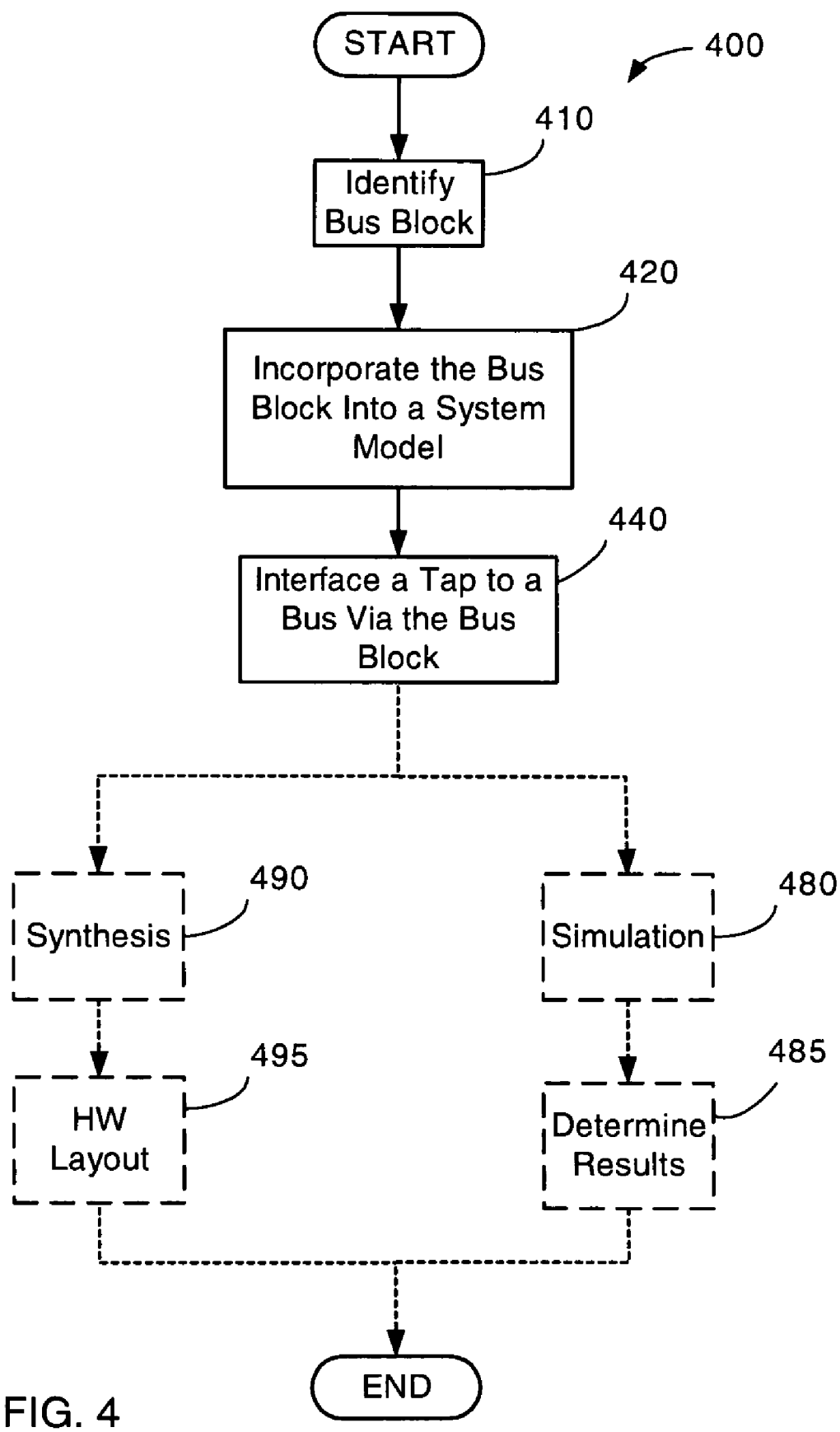
FIG. 4 is a flow diagram for a method of modeling, simulating or synthesizing a design in a high-level modeling system of unidirectional functionality in accordance with exemplary embodiments of the present invention.
Figure 10:
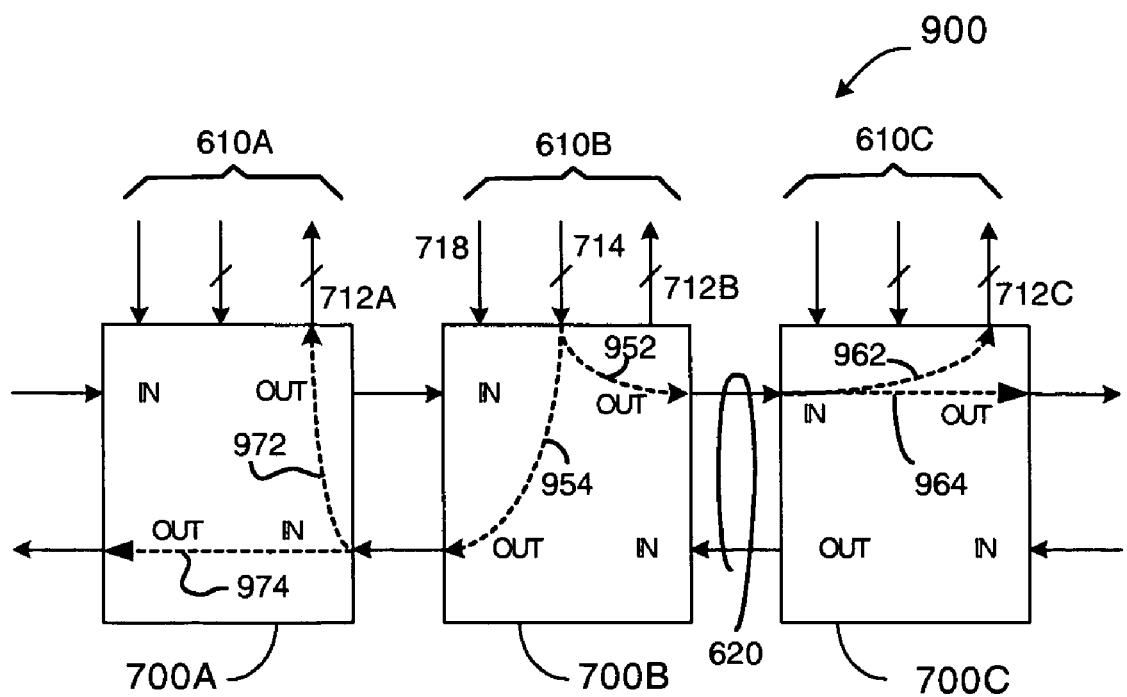
FIG. 10 shows the representation of the plurality of bus-blocks of FIG. 9 and further illustrating signal propagation during a simulation in accordance with an embodiment of the present invention.

In another embodiment, referencing FIG. 4, a method of modeling 400 a design such as an electrical system model may comprise identifying 410 a bus-block (700 of FIG. 10). The bus-block may then be incorporated 420 within a system model for a design—such as the manner in which bus-block 700B is incorporated in system model 900 as illustrated in FIG. 9. The bus-block may be disposed in series with and between first and second ports for a bus, which first and second ports of the bus may be further represented by unidirectional, oppositely directed data paths.

Further referencing FIGS. 4 and 9, a tap to the bus may be represented by interfacing (440 of FIG. 4) the tap (610B of FIG. 9) via the identified bus-block 700B. A tri-state buffer may also be emulated in series with one of the data input 714 or data output 712 ports of the tap 610B. A write enable line 718 of the tap 610B may be coupled to the control terminal of the tri-state buffer.

The designed electrical system model (e.g., 900 of FIG. 9) may then be simulated (480 of FIG. 4). The simulation may simulate operation of the design by emulating elements thereof responsive to various inputs. For example, as illustrated in FIG. 10, a signal may be simulated at the data input port 714 of tap 610B. Responsive to this presentation of the input signal, signals (dashed lines 952, 954 in FIG. 10) may be forwarded to the respective outputs of the first and second bus ports of the bus-block. In a further embodiment, the signals (952, 954) that are forwarded may be related to the signal received at the tap input 714. Additionally, the signals may be forwarded dependent on the condition of a write enable signal at the write enable input 718 of tap 610B.

In another perspective, the forwarding of signals 952, 954 may be characterized as being presented to output terminals of the unidirectional and oppositely directed data links, which, although not specifically illustrated in FIG. 10, may be emulated to extend through the bus-block for modeling of a bi-directional bus.

The presentment of signals 952, 954 at the bus-block's outputs for the first and second bus ports may be further conditioned, during simulation, upon the absence of signals at any one of the inputs for the first and second bus ports. If a signal is present at an input of either bus port when tap input 714 receives a signal, or when the write enable line has been enabled under such condition, then the simulation may report a collision event.

Signal propagation along the bus may continue responsive to signals 952, 954. When these signals are received at the inputs to bus ports of neighboring bus-blocks 700C, 700A, they may result in further propagations of signals (e.g., as represented by dashed lines 962, 964, 972, 974) to outputs of the other bus ports and tap outputs 712.

Further referencing FIG. 4, results from the simulation may then be determined 485 and might also be recorded or displayed—e.g., by CAD system 200 of FIG. 2.

Having a model or design to an electrical system, the model may be processed 490 by a synthesis tool (e.g., via a translation module of system generator) to produce, e.g., a HW netlist. In a particular embodiment, an HDL netlist may be obtained to assist the synthesis realization and/or hardware layout 495. Again, technology platforms may be specified for the HW realizations.

Referencing FIGS. 7 and 5, the synthesis tool may initiate a code generator to produce a netlist for HW layout. If a bus-block representation (e.g. bus-block 700 of FIG. 7) is found, the code generator may provide a netlist for implementing a tri-state circuit such as the tri-state circuit 500 as was described previously herein with reference to FIG. 5. Accordingly, a tap input 514 may source the input of tri-state buffer, while its output may drive tap output 512 and bi-directional bus 516. The netlist may further represent control port 518, which may be wired to pre-defined logic.

In an FPGA technology platform, the code generator may use tri-state buffers of the fabric and/or of the I/O blocks to interface the bi-directional buses. By using these buffers, connections can be made both internally and externally to the buses of the FPGA.

During design and synthesis of an electrical system, a computer aided design system may establish rules by which to guide configuration of a bus architecture with peripherals. For example, the design system may require that any peripheral interface a bus via a bus-block. Accordingly, the buses may be identified by name and a bus-block identified by the same name may be associated with the bus.

While certain exemplary features of the embodiments of the invention have been illustrated and described herein, many modifications, substitutions, changes and equivalents may now occur to those skilled in the art. It is, therefore, to be understood that the appended claims are intended to cover all such embodiments and changes as fall within the spirit of the invention.

What we claim:

1. A method of analyzing a design in a high level modeling system that supports unidirectional links, comprising:
   selecting a link represented by at least a portion of the design to be simulated within the high level modeling system;
   determining a directionality for the link selected;
   in response to determining the link to be bidirectional, emulating the link in the design using first and second unidirectional links within the high level modeling system; and
   responsive to determining a tap interconnect represented by another portion of the design to be coupled to the bidirectional link, emulating the tap interconnect in the design of the circuit system model using at least one unidirectional input line and a unidirectional output line.

2. The method of claim 1, in which the emulating the link represents the second unidirectional link in opposite data-routing orientation relative to the first unidirectional link.

3. The method of claim 2, further comprising:
   simulating signal excitation on at least a portion of the design, the portion to model a circuit; and
   determining results from the simulating signal excitation.

4. The method of claim 3, in which the simulating and determining results are performed using the emulated first and second unidirectional links.

5. The method of claim 1, further comprising emulating the unidirectional output line in parallel relationship to the at least one unidirectional input line.

6. The method of claim 1, further comprising:
   simulating signal excitation of at least a portion of the design with the emulated first and second unidirectional links and the emulated tap interconnect; and
   responsive to the simulating signal excitation, emulating a tri-state buffer in series with the unidirectional input line.

7. The method of claim 1, further comprising simulating operation of the design with the emulated first and second unidirectional links and emulated tap interconnect, the simulating to comprise:
   emulating a tri-state buffer in series with the unidirectional input line.

8. The method of claim 7, the simulating to further comprise:
   determining an absence of an input signal on each of the first and second unidirectional links; and
   conditioning an enablement of the emulated tri-state buffer on determining the absence of an input signal on each of the first and the second unidirectional links.

9. The method of claim 1, further comprising:
   simulating operation of at least a portion of the design with the emulated first and second unidirectional links and emulated tap interconnect, the design to model a circuit system, and the simulating to comprise:
   representing a signal on each of the unidirectional output line and the outputs of the first and second unidirectional links responsive to determining a signal being represented at the at least one unidirectional input line.

10. The method of claim 9, the simulating further comprising:
    representing a signal on the unidirectional output line and the output of the first/second unidirectional link responsive to a signal being represented at the input of the second/first unidirectional link.

11. The method of claim 10, the simulating further comprising:
    identifying a collision event responsive to determining a signal represented at the input of either one of the first or second unidirectional links when representing a signal presented to the unidirectional input line.

12. A computer readable medium having stored thereon computer readable instructions to perform, when executed by a computer in a high level modeling system supporting unidirectional links, analysis of at least a portion of a system model by a method comprising:
    retrieving from memory data representative of a system model to be simulated within the high level modeling system;
    determining if a link represented by at least a portion of the system model is to be bi-directional;
    based on the determining of the link to be bidirectional, modifying the system model by using two separate and oppositely directed, unidirectional links for emulating the bi-directional link within the high level modeling system; and
    realizing at least a portion of the system model, the realizing to comprise:
    representing first and second, oppositely directed data-routing, unidirectional lines for a tap to interconnect the bidirectional link,
    representing a tri-state buffer in series with the first one of the unidirectional lines for the tap, and
    representing the tri-state buffer to drive the second one of the unidirectional lines for the tap and the two separate unidirectional links.

13. The medium of claim 12, in which the method further comprises:
    simulating signal excitation of at least a portion of the system model modified with the two separate unidirectional links; and
    recording responses from the simulating.

14. The medium of claim 12, in which the method further comprises:
    determining a first signal represented at the first unidirectional line for the tap; and
    responsive to the determining of the first signal at the first unidirectional line for the tap, representing a second signal on the second unidirectional line for the tap and the two separate unidirectional links.

15. The medium of claim 14, in which the method further comprises:
    identifying a collision responsive to determining a signal being represented at an input of either one of the first and second unidirectional links when determining a signal represented at the first unidirectional line for the tap.

16. A method of analyzing a design in a high level modeling system that supports unidirectional links, comprising:

selecting a link represented by at least a portion of the design;

determining a directionality for the link selected;

in response to determining the link to be bidirectional, emulating the link in the design using first and second unidirectional links;

responsive to determining a tap interconnect represented by another portion of the design to be coupled to the bidirectional link, emulating the tap interconnect in the design of the circuit system model using at least one unidirectional input line and a unidirectional output line; and simulating operation of at least a portion of the design with the emulated first and second unidirectional links and emulated tap interconnect, the design to model a circuit system, and the simulating to comprise:

representing a signal on each of the unidirectional output line and the outputs of the first and second unidirectional links responsive to determining a signal being represented at the at least one unidirectional input line.

17. The method of claim 16, the simulating further comprising:

representing a signal on the unidirectional output line and the output of the first/second unidirectional link responsive to a signal being represented at the input of the second/first unidirectional link.

18. The method of claim 17, the simulating further comprising:

identifying a collision event responsive to determining a signal represented at the input of either one of the first or second unidirectional links when representing a signal presented to the unidirectional input line.

* * * * *